(12) United States Patent
Yang (10) Patent No.: US 9,069,024 B2
(45) Date of Patent: Jun. 30, 2015

(54) INSULATION RESISTANCE MEASUREMENT CIRCUIT HAVING SELF-TEST FUNCTION WITHOUT GENERATING LEAKAGE CURRENT

(75) Inventor: Jeong Hwan Yang, Busan (KR)

(73) Assignee: SK INNOVATION CO., LTD. (KR)

( * ) Notice: Subject to any disclaimer, the term of this patent is extended or adjusted under 35 U.S.C. 154(b) by 5 days.

(21) Appl. No.: 13/823,268

(22) PCT Filed: Sep. 16, 2011

(86) PCT No.: PCT/KR2011/006840
§ 371 (c)(1),
(2), (4) Date: Mar. 26, 2013

(87) PCT Pub. No.: WO2012/036498
PCT Pub. Date: Mar. 22, 2012

(65) Prior Publication Data
US 2013/0176041 A1 Jul. 11, 2013

(30) Foreign Application Priority Data
Sep. 17, 2010 (KR) ......................... 10-2010-0091937

(51) Int. Cl.
*G01R 27/14* (2006.01)
*G01R 27/02* (2006.01)
*B60L 3/00* (2006.01)
*G01R 31/02* (2006.01)

(52) U.S. Cl.
CPC ............... *G01R 27/14* (2013.01); *B60L 3/0069* (2013.01); *G01R 27/025* (2013.01); *G01R 31/025* (2013.01)

(58) Field of Classification Search
None
See application file for complete search history.

(56) References Cited

U.S. PATENT DOCUMENTS

| 2004/0189330 | A1* | 9/2004 | Herb et al. | 324/691 |
| 2010/0156426 | A1 | 6/2010 | Kang et al. | |
| 2010/0308841 | A1* | 12/2010 | Karrer et al. | 324/551 |

FOREIGN PATENT DOCUMENTS

| JP | 02159579 | 6/1990 |
| JP | 07020185 | 1/1995 |
| JP | 08160082 | 6/1996 |
| JP | 10062462 | 3/1998 |
| JP | 2000214194 | 8/2000 |
| JP | 2003066090 | 3/2003 |
| JP | 2004012246 | 1/2004 |
| JP | 2004219414 | 8/2004 |
| JP | 2007333529 | 12/2007 |
| KR | 20090024573 | 3/2009 |
| KR | 1020100019976 | 2/2010 |
| KR | 1020100043413 | 4/2010 |
| KR | 1020100105957 | 10/2010 |
| KR | 1020100105962 | 10/2010 |

OTHER PUBLICATIONS

International Search Report—PCT/KR2011/006840 dated Mar. 21, 2012.

* cited by examiner

*Primary Examiner* — Melissa Koval
*Assistant Examiner* — Stephen G Armstrong
(74) *Attorney, Agent, or Firm* — Cantor Colburn LLP (57) ABSTRACT

An insulation resistance measurement circuit in which switching of first and second switches is controlled such that a leakage current may not be generated in measuring insulation resistance, and voltages output through first and second operational amplifiers are measured after opening the first and second switches and closing third and fourth switches for self-testing of the insulation resistance measurement circuit.

18 Claims, 7 Drawing Sheets

Schematic

Schematic

Figure 7

INSULATION RESISTANCE MEASUREMENT CIRCUIT HAVING SELF-TEST FUNCTION WITHOUT GENERATING LEAKAGE CURRENT

TECHNICAL FIELD

The present invention relates to an insulation resistance measurement circuit and, more particularly, to an insulation resistance measurement circuit in which switching of first and second switches is controlled such that a leakage current may not be generated in measuring insulation resistance, and voltages output through first and second operational amplifiers are measured after opening the first and second switches and closing third and fourth switches for self-testing of the insulation resistance measurement circuit.

BACKGROUND ART

A hybrid vehicle using a high voltage battery has a system for automatically cutting off power of the main high voltage battery in an emergency. The emergency refers to an excessive short circuit due to obsolescence of relevant components, an excessive short circuit caused by a short stemming from a breakdown of components due to a dielectric breakdown, etc., and an external impact, a dielectric breakdown, or the like.

In case of an emergency in a vehicle, an upper component which controls high voltage components such as a battery management system (BMS), a hybrid control unit (HCU), or the like, issues a command for cutting off a main power source to regulate power. For the high voltage-related components, voltages and currents of a line connecting a power source are monitored through an array of programs or sensors, and when a voltage and a current which are not within a normal range are detected, when there is a leakage current greater than an allowable value, or when there is an insulation resistance breakdown greater than an allowable value, or the like, the main power source is cut off by CAN communication or a signal transmission.

In this manner, the measurement of insulation resistance is very important in the hybrid vehicle using a high voltage battery. One of methods for measuring a leakage current between the high voltage battery and the hybrid vehicle is breaking down insulation and forcibly making a DC current flow, but this method is disadvantageous in that insulation is broken down while insulation resistance is being measured.

Thus, in order to solve this problem, a coupling condenser is connected between the high voltage battery and the hybrid vehicle and an AC signal is applied to the coupling condenser to measure an insulation resistance component. However, this method has shortcomings in that it has a great amount of restrictions in designing a circuit because a current for charging the coupling condenser and a current for discharging the coupling condenser must pass through the same circuit.

Therefore, a development of a small, light-weight, and low-priced insulation resistance measurement circuit capable of simply and precisely measuring insulation resistance between a chassis ground and a high voltage battery of a hybrid vehicle is required.

DISCLOSURE OF INVENTION

Technical Problem

An object of the present invention is to provide an insulation resistance measurement circuit in which switching of first and second switches is controlled such that a leakage current may not be generated in measuring insulation resistance, and voltages output through first and second operational amplifiers are measured after opening the first and second switches and closing third and fourth switches for self-testing of the insulation resistance measurement circuit. Accordingly, a leakage current cannot be generated in measuring insulation resistance in a simpler manner, and an insulation resistance sensing part can be inspected by the insulation resistance measurement circuit itself.

Solution to Problem

In one general aspect, an insulation resistance measurement circuit includes: a source resistance unit including a first source resistance unit connected to a positive terminal of an insulation resistance measurement battery and a second source resistance unit connected to a negative terminal of the insulation resistance measurement battery and the first source resistance unit; a voltage sensing unit including a first operational amplifier sensing the voltage of the first source resistance unit, as a first voltage, and the voltage of the second source resistance unit, as a second voltage; a leakage current interrupting unit including a first switch connected to the positive terminal of the insulation resistance measurement battery and the first source resistance unit and a second switch connected to the negative terminal of the insulation resistance measurement battery and the second source resistance unit; a measurement circuit testing unit including a third switch connected to the first operational amplifier and a first voltage source and a fourth switch connected to the second operational amplifier and a second voltage source; and an insulation resistance measurement unit measuring insulation resistance of the insulation resistance measurement battery through the first and second voltages.

The first operational amplifier may be connected to the first source resistance unit through a non-inverting terminal and an inverting terminal, sense a first source voltage applied to the first source resistance unit, as a first voltage, and output the first voltage through an output terminal, and the second operational amplifier may be connected to the second source resistance unit through a non-inverting terminal and an inverting terminal, sense a second source voltage applied to the second source resistance unit, as the second voltage, and output the second voltage through an output terminal.

When a positive electrode of the insulation resistance measurement battery is broken down, the leakage current interrupting unit may open the first switch to prevent current from flowing to the first source resistance unit, and when a negative electrode of the insulation resistance measurement battery is broken down, the leakage current interrupting unit may open the second switch to prevent current from flowing to the second source resistance unit.

When the voltage of the insulation resistance measurement battery is V, insulation resistance of the insulation resistance measurement battery is Riso, the first and second source resistances are R, respectively, and the second voltage is V2, the second voltage V2 measured when the positive electrode of the insulation resistance measurement battery is broken down may be, $$V2 = \frac{R}{R_{iso} + R} V.$$

When the voltage of the insulation resistance measurement battery is V, insulation resistance of the insulation resistance measurement battery is Riso, the first and second source resistances are R, respectively, and the first voltage is V1, the first voltage V1 measured when the negative electrode of the insulation resistance measurement battery is broken down may be, $$V1 = \frac{R}{R_{iso} + R} V.$$

The measurement circuit testing unit may open the first and second switches and close the third and fourth switches, and measures the first and second voltages to determine whether or not the first and second operational amplifiers have an error.

The insulation resistance measurement battery may be a high voltage battery of a hybrid vehicle.

Advantageous Effects of Invention

The insulation resistance measurement circuit according to an embodiment of the present invention can obtain an effect that switching of first and second switches is controlled such that a leakage current may not be generated in measuring insulation resistance, and voltages output through first and second operational amplifiers are measured after opening the first and second switches and closing third and fourth switches for self-testing of the insulation resistance measurement circuit, whereby a leakage current cannot be generated in measuring insulation resistance in a simpler manner, and an insulation resistance sensing part can be inspected by the insulation resistance measurement circuit itself.

BRIEF DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS

101: insulation resistance measurement battery
102: insulation resistance unit
103: first source resistance unit
104: second source resistance unit
105: first operational amplifier
106: second operational amplifier
107: first switch
108: second switch
109: third switch
110: fourth switch
112: first voltage source
113: second voltage source

BEST MODE FOR CARRYING OUT THE INVENTION

Hereinafter, the embodiments of the present invention will be described in detail with reference to accompanying drawings.

Figure 1:
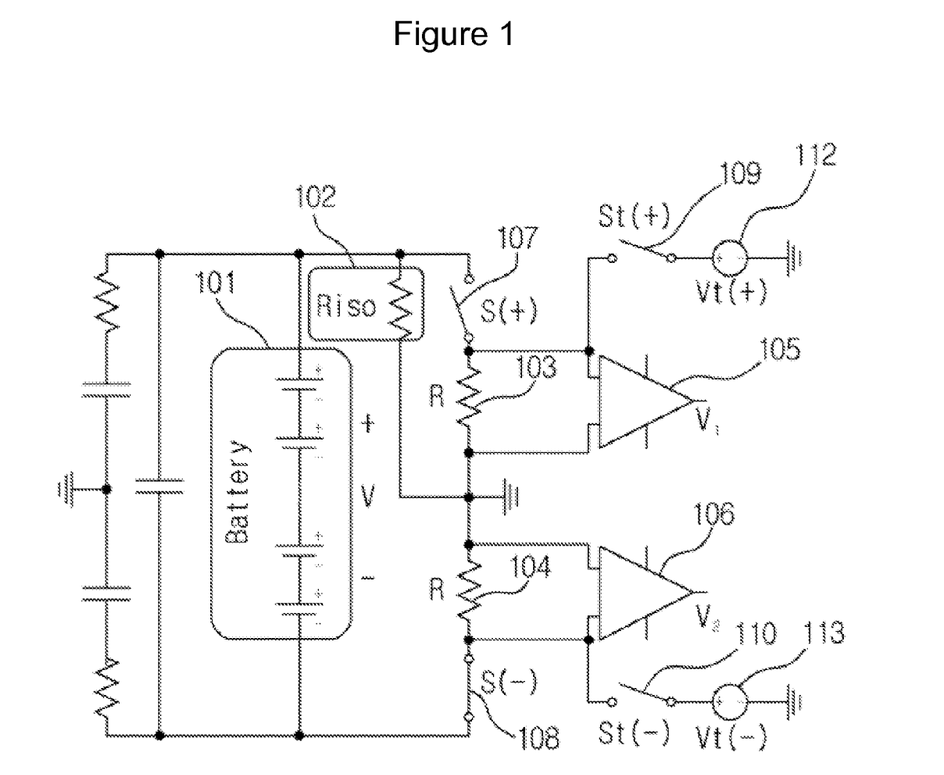
FIG. 1 is a circuit diagram showing a connection of an insulation resistance measurement circuit when a positive electrode of an insulation resistance measurement battery is broken down according to an embodiment of the present invention.
Figure 2:
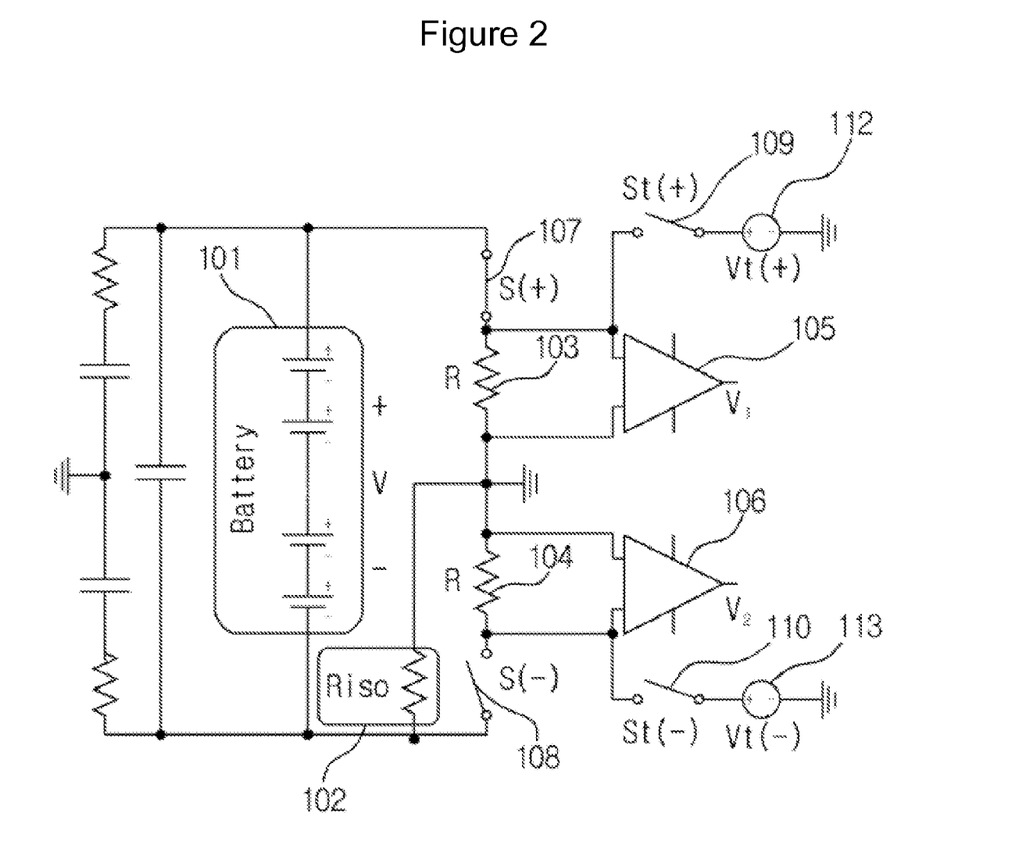
FIG. 2 is a circuit diagram showing a connection of the insulation resistance measurement circuit when a negative electrode of the insulation resistance measurement battery is broken down according to an embodiment of the present invention.
Figure 3:
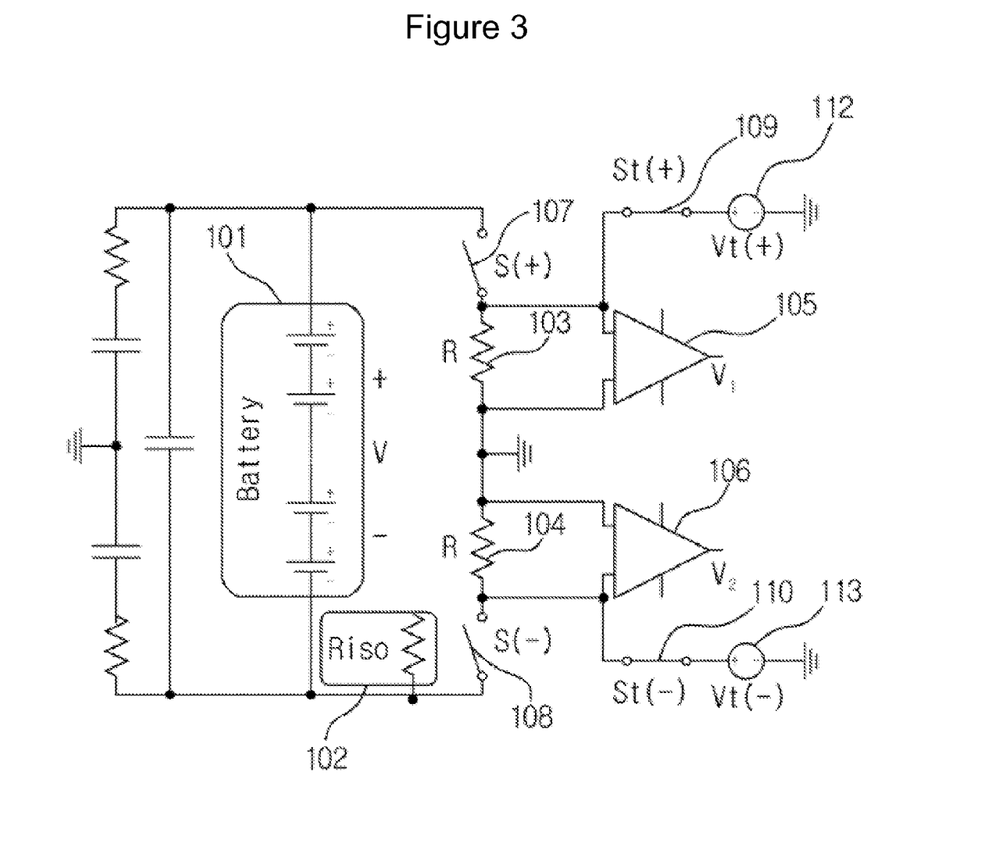
FIG. 3 is a circuit diagram showing a connection of the insulation resistance measurement circuit in case of self-testing according to an embodiment of the present invention.

FIGS. 1 to 3 are circuit diagrams showing the configuration of an insulation resistance measurement circuit according to an embodiment of the present invention.

FIG. 1 is a circuit diagram showing a connection of an insulation resistance measurement circuit when a positive electrode of an insulation resistance measurement battery is broken down according to an embodiment of the present invention. FIG. 2 is a circuit diagram showing a connection of the insulation resistance measurement circuit when a negative electrode of the insulation resistance measurement battery is broken down according to an embodiment of the present invention. FIG. 3 is a circuit diagram showing a connection of the insulation resistance measurement circuit in case of self-testing according to an embodiment of the present invention.

The insulation resistance measurement circuit according to an embodiment of the present invention includes an insulation resistance measurement battery 101, an insulation resistance unit 102, source resistance units 103 and 104, voltage sensing units 105 and 106, leakage current interrupting units 107 and 108, measurement circuit testing units 109 and 110, and an insulation resistance measurement unit (not shown).

According to an embodiment of the present invention, the source resistance units include first and second source resistances 103 and 104. The voltage sensing units include first and second operational amplifiers 105 and 106. The leakage current interrupting units include first and second switches 107 and 108. The measurement circuit testing units include third and fourth switches 109 and 110.

The source resistance units include the first source resistance unit 103 connected to a positive terminal of the insulation resistance measurement battery 101 and the second source resistance unit 104, and the second source resistance unit 104 connected to a negative terminal of the insulation resistance measurement battery 101 and the first source resistance unit 103. Namely, the first source resistance unit 103 is connected to the positive terminal of the insulation resistance measurement battery 101 through the first switch 107, and the second source resistance unit 104 may be connected to the negative terminal of the insulation resistance measurement battery 101 through the second switch 108. The first and second source resistance units 103 and 104 may be connected through a ground.

The voltage sensing units sense a voltage of the first source resistance unit 103, as a first voltage, and a voltage of the second source resistance unit 104, as a second voltage. As mentioned above, the voltage sensing units include the first operational amplifier 105 and the second operational amplifier 106.

A non-inverting terminal and an inverting terminal of the first operational amplifier 105 may be connected to both ends of the first source resistance unit 103, respectively. The first operational amplifier 105 may sense a first source voltage applied to the first source resistance unit 103, as a first voltage, and output the sensed first voltage through an output terminal.

A non-inverting terminal and an inverting terminal of the second operational amplifier 106 may be connected to both ends of the second source resistance unit 104, respectively. The second operational amplifier 106 may sense a second source voltage applied to the second source resistance unit 104, as a second voltage, and output the sensed second voltage through an output terminal.

The leakage current interrupting units include the first switch 107 connected to the positive terminal of the insulation resistance measurement battery 101 and the first source resistance unit 103, and the second switch 108 connected to the negative terminal of the insulation resistance measurement battery 101 and the second source resistance unit 104.

The measurement circuit testing units include the third switch 109 connected to the first operational amplifier 105 and a first voltage source 112 and the fourth switch 110 connected to the second operational amplifier 106 and a second voltage source 113. The third switch 109 may be connected to the non-inverting terminal of the first operational amplifier 105, and the fourth switch 110 may be connected to the inverting terminal of the second operational amplifier 106.

The insulation resistance measurement unit measures an insulation resistance unit 102 of the insulation resistance measurement battery 101 through the first and second voltages. For example, the insulation resistance measurement unit may include a microcontroller. The microcontroller receives the first and second voltages. The microcontroller may measure the insulation resistance unit 102 of the insulation resistance measurement battery 101 through the first and second voltages. A description thereof will be omitted.

According to an embodiment of the present invention, when a positive electrode of the insulation resistance measurement battery 101 is broken down, the first switch 107 is open to prevent a current from flowing to the first source resistance unit 103, and when a negative electrode of the insulation resistance measurement battery 101 is broken down, the second switch 108 is open to prevent a current from flowing to the second source resistance unit 104. In this manner, a leakage current cannot be generated in measuring insulation resistance.

As shown in FIGS. 1 and 2, the voltage of the insulation resistance measurement battery 101 is V, the insulation resistance unit 102 of the insulation resistance measurement battery 101 is Riso, a resistance value of each of the first and second source resistance units 103 and 104 is R, the first voltage output from the first operational amplifier 105 is V1, and the second voltage output from the second operational amplifier 106 is V2.

The second voltage V2 measured when the positive electrode of the insulation resistance measurement battery 101 is broken down is expressed as Equation 1 below.

$$V2 = \frac{R}{R_{iso} + R} V \quad (1)$$

The first voltage V1 measured when the negative electrode of the insulation resistance measurement battery 101 is broken down is expressed as Equation 2 below.

$$V1 = \frac{R}{R_{iso} + R} V \quad (2)$$

According to an embodiment of the present invention, whether or not the first and second operational amplifiers 105 and 106 have an error may be determined by measuring voltages output from the first and second operational amplifiers 105 and 106 in a state in which the first and second switches 107 and 108 are opened and the third and fourth switches 109 and 110 are closed.

As shown in FIG. 3, voltage values of the first and second voltage sources 112 and 113 are Vt, respectively.

The first voltage measured in case of self-testing is expressed as Equation 3 below.

$$V1 = Vt \quad (3)$$

The second voltage measured in case of self-testing is expressed as Equation 4 below.

$$V2 = Vt \quad (4)$$

Figure 4:
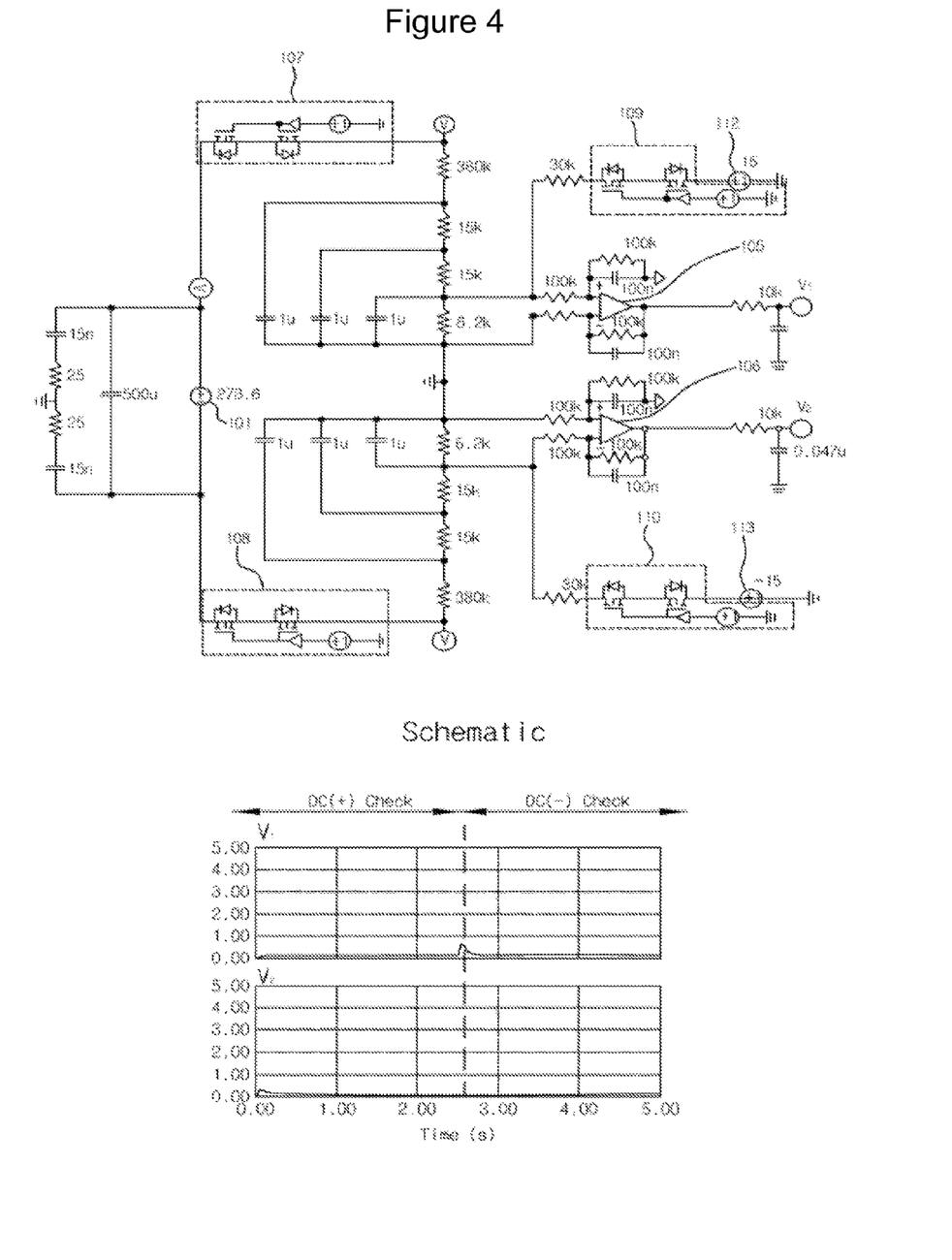
FIG. 4 is a view showing simulation results when insulation resistance of the insulation resistance measurement battery is infinite according to an embodiment of the present invention.
Figure 5:
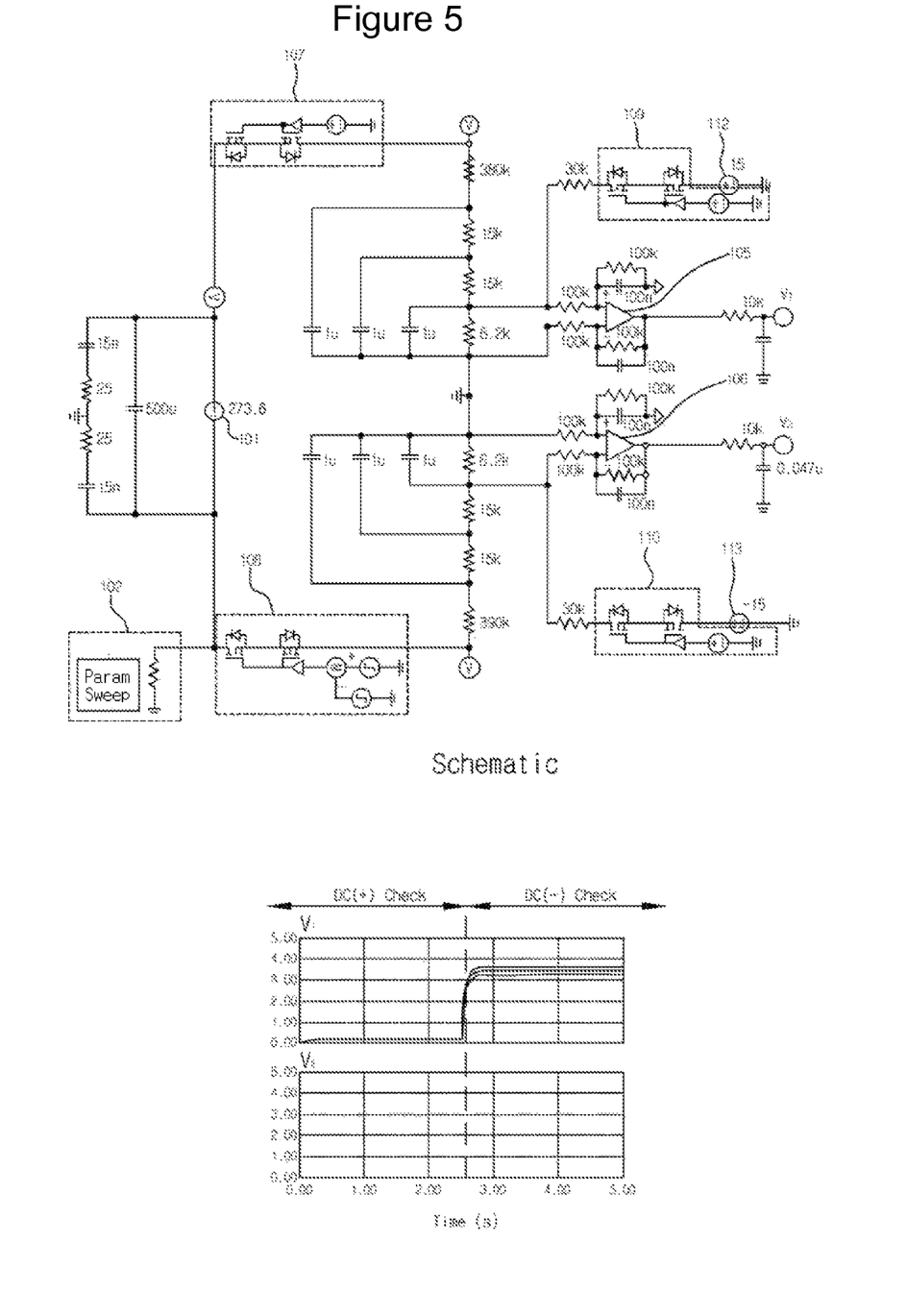
FIG. 5 is a view showing simulation results when the negative electrode of the insulation resistance measurement battery is broken down according to an embodiment of the present invention.
Figure 6:
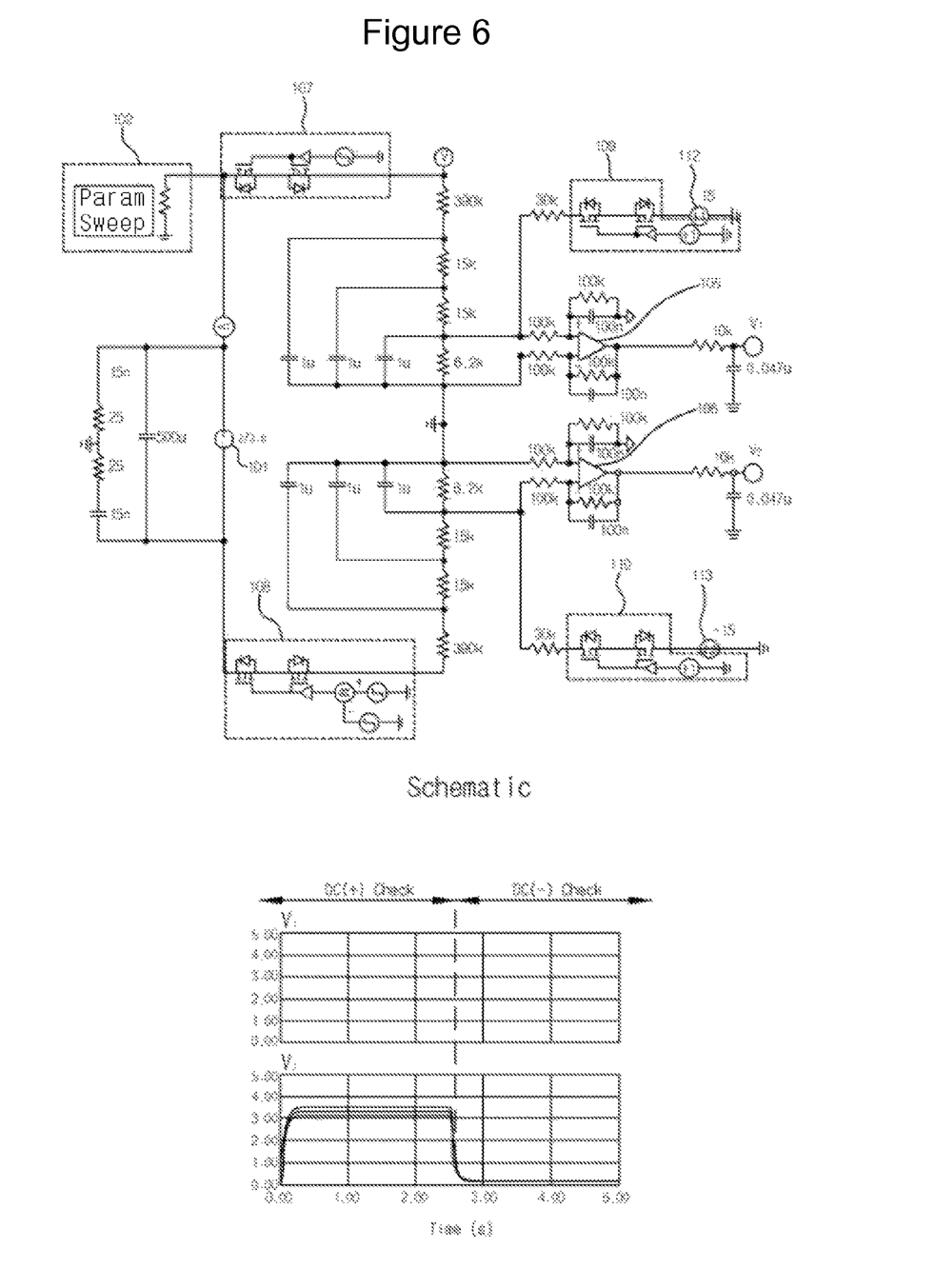
FIG. 6 is a view showing simulation results when the positive electrode of the insulation resistance measurement battery is broken down according to an embodiment of the present invention.
Figure 7:
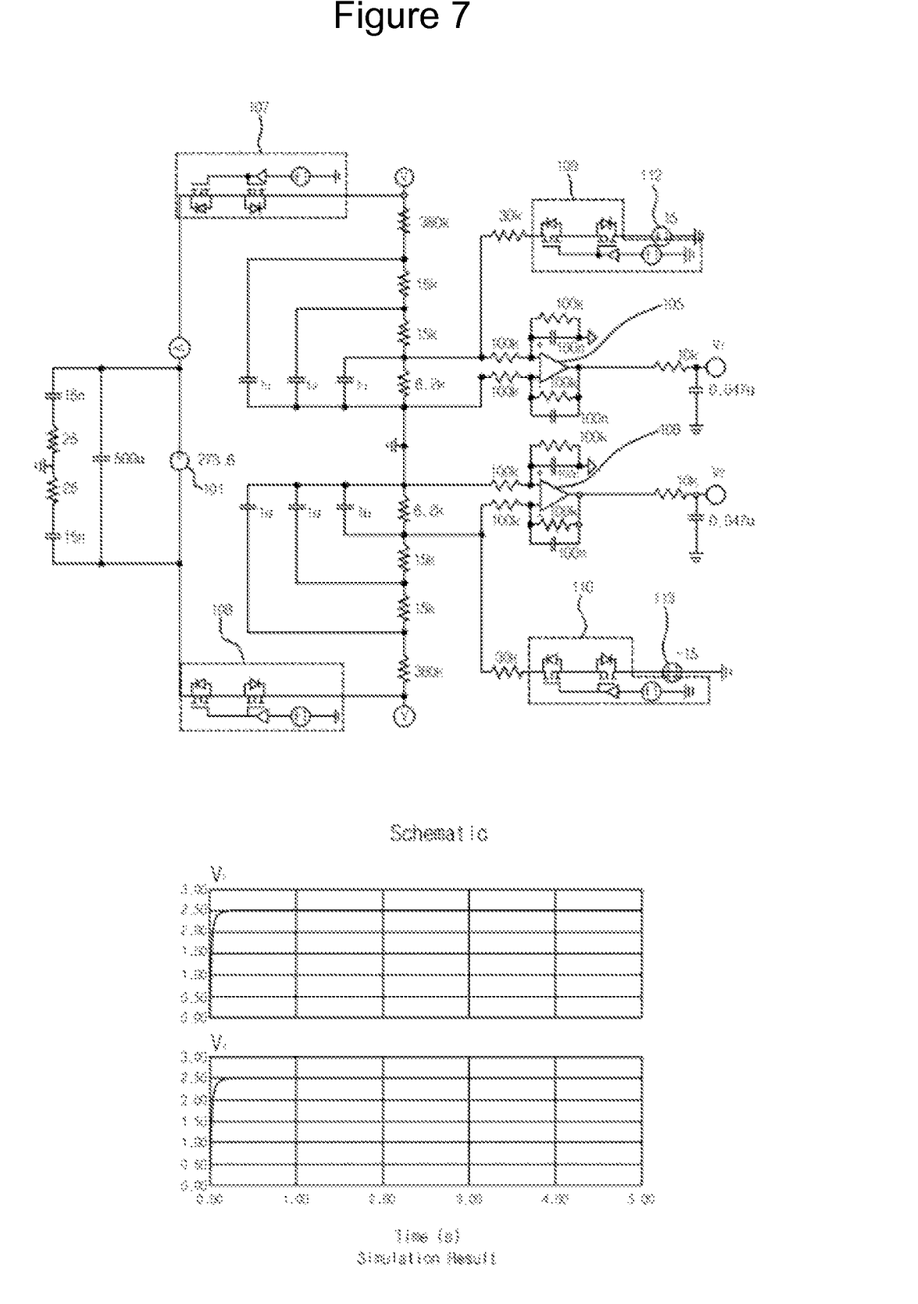
FIG. 7 is a view showing simulation results in case of self-testing of the insulation resistance measurement circuit according to an embodiment of the present invention.

FIG. 4 is a view showing simulation results when insulation resistance of the insulation resistance measurement battery is infinite according to an embodiment of the present invention. FIG. 5 is a view showing simulation results when the negative electrode of the insulation resistance measurement battery is broken down according to an embodiment of the present invention. FIG. 6 is a view showing simulation results when the positive electrode of the insulation resistance measurement battery is broken down according to an embodiment of the present invention. FIG. 7 is a view showing simulation results in case of self-testing of the insulation resistance measurement circuit according to an embodiment of the present invention.

An insulation resistance measurement circuit can be confirmed through a PSIM, a simulation program.

For example, it is assumed that the voltage of the insulation resistance measurement battery 101 is 273.6V, and the insulation resistance unit 102 of the insulation resistance measurement battery 101 is 27.36 kΩ.

As described above, FIG. 4 shows a case in which when the insulation resistance unit 102 of the insulation resistance measurement battery 101 is infinite, the insulation resistance unit 102 is normal without being broken down. In this case, as shown in FIG. 4, the output voltages of the first and second operational amplifiers 105 and 106 are nearly 0V, respectively.

As described above, FIG. 5 shows a case in which when the negative electrode of the insulation resistance measurement battery 101 is broken down, the insulation resistance unit 102 of the insulation resistance measurement battery 101 is connected to the negative terminal of the insulation resistance measurement battery 101.

For example, when the insulation resistance unit 102 of the insulation resistance measurement battery 101 is 27.36 kΩ, an output voltage of the first operational amplifier 105 is 3.636V, and that of the second operational amplifier 106 is nearly 0V. Also, when the insulation resistance unit 102 of the insulation resistance measurement battery 101 is 54.72 kΩ, an output voltage of the first operational amplifier 105 is 3.431V, and that of the second operational amplifier 106 is nearly 0V. Also, when the insulation resistance unit 102 of the insulation resistance measurement battery 101 is 82.08 kΩ, an output voltage of the first operational amplifier 105 is 3.249V, and that of the second operational amplifier 106 is nearly 0V.

As noted from the simulation results of FIG. 5, when the output voltage of the first operational amplifier 105 is measured and the voltage value thereof is not close to 0V, it may be assumed that the negative electrode of the insulation resistance measurement battery 101 was broken down.

As described above, FIG. 6 shows a case in which when the positive electrode of the insulation resistance measurement battery 101 is broken down, the insulation resistance unit 102 of the insulation resistance measurement battery 101 is connected to the positive terminal of the insulation resistance measurement battery 101.

For example, when the insulation resistance unit 102 of the insulation resistance measurement battery 101 is 27.36 kΩ, an output voltage of the first operational amplifier 105 is nearly 0V, and that of the second operational amplifier 106 is 3.636V. Also, when the insulation resistance unit 102 of the insulation resistance measurement battery 101 is 54.72 kΩ, an output voltage of the first operational amplifier 105 is nearly 0V, and that of the second operational amplifier 106 is 3.431V. Also, when the insulation resistance unit 102 of the insulation resistance measurement battery 101 is 82.08 kΩ, an output voltage of the first operational amplifier 105 is nearly 0V, and that of the second operational amplifier 106 is 3.249V.

As noted from the simulation results of FIG. 6, when the output voltage of the second operational amplifier 106 is measured and the voltage value thereof is not close to 0V, it may be assumed that the positive electrode of the insulation resistance measurement battery 101 was broken down.

As noted from the simulation results of FIGS. 5 and 6, no more than five seconds is taken to check the positive electrode and negative electrode breakdown of the insulation resistance measurement battery 101.

As described above, in FIG. 7, the insulation resistance measurement circuit performs self-testing to check whether or not the first and second operational amplifiers 105 and 106 which sense the insulation resistance unit 102 of the insulation resistance measurement battery 101. Here, as shown in FIG. 7, output voltages of the first and second operational amplifiers 105 and 106 are nearly 2.5V, respectively.

As noted from the simulation results of FIG. 7, when the output voltages of the first and second operational amplifiers 105 and 106 are measured and the voltage values thereof are not close to 0V, it may be assumed that the first and second operational amplifiers 105 and 106 have an error.

As described above, according to the embodiment of the present invention, switching of the first and second switches is controlled such that a leakage current may not be generated in measuring insulation resistance, and voltages output through first and second operational amplifiers are measured after opening the first and second switches and closing third and fourth switches for self-testing of the insulation resistance measurement circuit, whereby a leakage current cannot be generated in measuring insulation resistance in a simpler manner, and an insulation resistance sensing part can be inspected by the insulation resistance measurement circuit itself.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Accordingly, the scope of the present invention is not construed as being limited to the described embodiments but is defined by the appended claims as well as equivalents thereto.

The invention claimed is:

1. An insulation resistance measurement circuit comprising:
    a source resistance unit including a first source resistance unit connected to a positive terminal of an insulation resistance measurement battery and a second source resistance unit, and the second source resistance unit connected to a negative terminal of the insulation resistance measurement battery and the first source resistance unit;
    a voltage sensing unit including a first operational amplifier sensing a voltage of the first source resistance unit, as a first voltage, and a second operational amplifier sensing a voltage of the second source resistance unit, as a second voltage;
    a leakage current interrupting unit including a first switch connected to the positive terminal of the insulation resistance measurement battery and the first source resistance unit and a second switch connected to the negative terminal of the insulation resistance measurement battery and the second source resistance unit;
    a measurement circuit testing unit including a third switch connected to the first operational amplifier and a first voltage source, and a fourth switch connected to the second operational amplifier and a second voltage source; and
    an insulation resistance measurement unit measuring insulation resistance of the insulation resistance measurement battery through the first and second voltages,
    wherein the measurement circuit testing unit opens the first and second switches and closes the third and fourth switches, and measures the first and second voltages to determine whether or not the first and second operational amplifiers have an error, thereby enabling self-testing.

2. The insulation resistance measurement circuit of claim 1, wherein the first operational amplifier is connected to the first source resistance unit through a non-inverting terminal and an inverting terminal, senses a first source voltage applied to the first source resistance unit, as a first voltage, and outputs the first voltage through an output terminal, and the second operational amplifier is connected to the second source resistance unit through a non-inverting terminal and an inverting terminal, senses a second source voltage applied to the second source resistance unit, as the second voltage, and outputs the second voltage through an output terminal.

3. The insulation resistance measurement circuit of claim 1, wherein when a positive electrode of the insulation resistance measurement battery is broken down, the leakage current interrupting unit opens the first switch to prevent current from flowing to the first source resistance unit, and when a negative electrode of the insulation resistance measurement battery is broken down, the leakage current interrupting unit opens the second switch to prevent current from flowing to the second source resistance unit.

4. The insulation resistance measurement circuit of claim 1, wherein when the voltage of the insulation resistance measurement battery is V, the insulation resistance of the insulation resistance measurement battery is $R_{iso}$, the first and second source resistances are R, respectively, and the second voltage is $V_2$, the second voltage $V_2$ measured when the positive electrode of the insulation resistance measurement battery is broken down is $$\frac{R}{R_{iso}+R}V.$$

5. The insulation resistance measurement circuit of claim 1, wherein when the voltage of the insulation resistance measurement battery is V, the insulation resistance of the insulation resistance measurement battery is $R_{iso}$, the first and second source resistances are R, respectively, and the first voltage is $V_1$, the first voltage $V_1$ measured when the negative electrode of the insulation resistance measurement battery is broken down is $$\frac{R}{R_{iso}+R}V.$$

6. The insulation resistance measurement circuit of claim 1, wherein the insulation resistance measurement battery is a high voltage battery of a hybrid vehicle.

7. A control insulation resistance measurement circuit comprising:
   a source resistance unit including a first source resistance unit connected to a positive terminal of an insulation resistance measurement battery and a second source resistance unit, and the second source resistance unit connected to a negative terminal of the insulation resistance measurement battery and the first source resistance unit;
   a voltage sensing unit including a first operational amplifier sensing a voltage of the first source resistance unit, as a first voltage, and a second operational amplifier sensing a voltage of the second source resistance unit, as a second voltage;
   a leakage current interrupting unit including a first switch connected to the positive terminal of the insulation resistance measurement battery and the first source resistance unit and a second switch connected to the negative terminal of the insulation resistance measurement battery and the second source resistance unit;
   a measurement circuit testing unit including a third switch connected to the first operational amplifier and a first voltage source, and a fourth switch connected to the second operational amplifier and a second voltage source;
   an insulation resistance measurement unit measuring insulation resistance of the insulation resistance measurement battery through the first and second voltages; and
   a controller configured to:
      open the first and second switches;
      close the third and fourth switches;
      measure the first and second voltages; and
      determine that the first and second operational amplifiers have an error in response to determining that values of the first and second voltages are not within a threshold voltage difference from zero volt.

8. The insulation resistance measurement circuit of claim 7, wherein the first operational amplifier is connected to the first source resistance unit through a non-inverting terminal and an inverting terminal, senses a first source voltage applied to the first source resistance unit, as a first voltage, and outputs the first voltage through an output terminal, and the second operational amplifier is connected to the second source resistance unit through a non-inverting terminal and an inverting terminal, senses a second source voltage applied to the second source resistance unit, as the second voltage, and outputs the second voltage through an output terminal.

9. The insulation resistance measurement circuit of claim 7, wherein the controller is further configure to:
   open the first switch to prevent current from flowing to the first source resistance unit when a positive electrode of the insulation resistance measurement battery is broken down; and
   open the second switch to prevent current from flowing to the second source resistance unit when a negative electrode of the insulation resistance measurement battery is broken down.

10. The insulation resistance measurement circuit of claim 7, wherein when the voltage of the insulation resistance measurement battery is V, the insulation resistance of the insulation resistance measurement battery is $R_{iso}$, the first and second source resistances are R, respectively, and the second voltage is $V_2$, the second voltage $V_2$ measured when the positive electrode of the insulation resistance measurement battery is broken down is, $$\frac{R}{R_{iso}+R}V.$$

11. The insulation resistance measurement circuit of claim 7, wherein when the voltage of the insulation resistance measurement battery is V, the insulation resistance of the insulation resistance measurement battery is $R_{iso}$, the first and second source resistances are R, respectively, and the first voltage is $V_1$, the first voltage $V_1$ measured when the negative electrode of the insulation resistance measurement battery is broken down is, $$\frac{R}{R_{iso}+R}V.$$

12. The insulation resistance measurement circuit of claim 7, wherein the insulation resistance measurement battery is a high voltage battery of a hybrid vehicle.

13. A method of testing an insulation resistance measurement circuit that comprises:
   a source resistance unit including a first source resistance unit connected to a positive terminal of an insulation resistance measurement battery and a second source resistance unit, and the second source resistance unit connected to a negative terminal of the insulation resistance measurement battery and the first source resistance unit;
   a voltage sensing unit including a first operational amplifier sensing a voltage of the first source resistance unit, as a first voltage, and a second operational amplifier sensing a voltage of the second source resistance unit, as a second voltage;
   a leakage current interrupting unit including a first switch connected to the positive terminal of the insulation resistance measurement battery and the first source resistance unit and a second switch connected to the negative terminal of the insulation resistance measurement battery and the second source resistance unit;
   a measurement circuit testing unit including a third switch connected to the first operational amplifier and a first voltage source, and a fourth switch connected to the second operational amplifier and a second voltage source; and an insulation resistance measurement unit measuring insulation resistance of the insulation resistance measurement battery through the first and second voltages, the method comprising:

opening the first and second switches;

closing the third and fourth switches;

measuring the first and second voltages; and determining that the first and second operational amplifiers have an error in response to determining that values of the first and second voltages are not within a threshold voltage difference from zero volt.

14. The method of claim 13, wherein the first operational amplifier is connected to the first source resistance unit through a non-inverting terminal and an inverting terminal, senses a first source voltage applied to the first source resistance unit, as a first voltage, and outputs the first voltage through an output terminal, and the second operational amplifier is connected to the second source resistance unit through a non-inverting terminal and an inverting terminal, senses a second source voltage applied to the second source resistance unit, as the second voltage, and outputs the second voltage through an output terminal.

15. The method of claim 13, further comprising:

opening the first switch to prevent current from flowing to the first source resistance unit when a positive electrode of the insulation resistance measurement battery is broken down; and opening the second switch to prevent current from flowing to the second source resistance unit when a negative electrode of the insulation resistance measurement battery is broken down.

16. The method of claim 13, wherein when the voltage of the insulation resistance measurement battery is V, the insulation resistance of the insulation resistance measurement battery is $R_{iso}$, the first and second source resistances are R, respectively, and the second voltage is $V_2$, the second voltage $V_2$ measured when the positive electrode of the insulation resistance measurement battery is broken down is, $$\frac{R}{R_{iso} + R} V.$$

17. The method of claim 13, wherein when the voltage of the insulation resistance measurement battery is V, the insulation resistance of the insulation resistance measurement battery is $R_{iso}$, the first and second source resistances are R, respectively, and the first voltage is $V_1$, the first voltage $V_1$ measured when the negative electrode of the insulation resistance measurement battery is broken down is, $$\frac{R}{R_{iso} + R} V.$$

18. The method of claim 13, wherein the insulation resistance measurement battery is a high voltage battery of a hybrid vehicle.

* * * * *